United States Patent
Choi

(10) Patent No.: US 8,627,134 B2
(45) Date of Patent: *Jan. 7, 2014

(54) SEMICONDUCTOR APPARATUS AND LOCAL SKEW DETECTING CIRCUIT THEREFOR

(75) Inventor: Hong-Sok Choi, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 378 days.

This patent is subject to a terminal disclaimer.

(21) Appl. No.: 13/041,467

(22) Filed: Mar. 7, 2011

(65) Prior Publication Data

US 2011/0148491 A1 Jun. 23, 2011

Related U.S. Application Data

(63) Continuation-in-part of application No. 11/963,166, filed on Dec. 21, 2007, now Pat. No. 7,904,742.

(30) Foreign Application Priority Data

Jul. 13, 2007 (KR) .................... 10-2007-0070405

(51) Int. Cl.
- *G06F 1/00* (2006.01)
- *G06F 1/12* (2006.01)
- *H03K 19/00* (2006.01)
- *H03L 1/00* (2006.01)
- *G11C 5/06* (2006.01)
- *G11C 21/00* (2006.01)
- *G06F 12/00* (2006.01)

(52) U.S. Cl.
USPC ........... 713/500; 713/401; 326/401; 327/161; 327/162; 365/63; 365/76; 711/100

(58) Field of Classification Search
USPC ............ 714/401, 500; 326/93; 327/161, 162; 365/63, 76; 711/100
See application file for complete search history.

(56) References Cited

U.S. PATENT DOCUMENTS

| | | | |
|---|---|---|---|
| 6,032,282 A | 2/2000 | Masuda et al. | |
| 6,239,627 B1 | 5/2001 | Brown et al. | |
| 6,297,679 B1 * | 10/2001 | Kim | 327/276 |
| 6,812,727 B2 | 11/2004 | Kobayashi | |
| 6,920,540 B2 | 7/2005 | Hampel et al. | |
| 7,236,035 B2 | 6/2007 | Shiratake et al. | |
| 2002/0024833 A1 | 2/2002 | Song et al. | |
| 2004/0202029 A1 | 10/2004 | Kim et al. | |
| 2006/0198214 A1 | 9/2006 | Kim et al. | |

FOREIGN PATENT DOCUMENTS

| | | |
|---|---|---|
| JP | 11-288865 | 10/1999 |
| KR | 1019990062446 A | 7/1999 |
| KR | 1020000003736 A | 1/2000 |
| KR | 1020030056186 A | 7/2003 |

* cited by examiner

*Primary Examiner* — Stefan Stoynov
(74) *Attorney, Agent, or Firm* — William Park & Associates Patent Ltd.

(57) ABSTRACT

A local skew detecting circuit for a semiconductor apparatus include a reference delay block located on the center of the semiconductor apparatus, the reference delay block being configured to receive a predetermined signal and generate a reference delay signal by delaying the predetermined signal by a delay time and a first timing detecting block located on one edge of the semiconductor apparatus, the first timing detecting block being configured to receive the predetermined signal, generate a first delay signal by delaying the predetermined signal by the delay time, and detect an enable timing order of the reference delay signal and the first delay signal to generate a first detection signal.

19 Claims, 3 Drawing Sheets

US 8,627,134 B2

SEMICONDUCTOR APPARATUS AND LOCAL SKEW DETECTING CIRCUIT THEREFOR

CROSS-REFERENCES TO RELATED APPLICATION

This application is a continuation-in-part of application Ser. No. 11/963,166, filed Dec. 21, 2007, titled "Local Skew Detecting Circuit For Semiconductor Memory Apparatus," which is incorporated herein by reference in its entirety as if set forth in full, and which claims priority under 35 U.S.C. 119(a) to Korean Application No. 10-2007-0070405, filed on Jul. 13, 2007, in Korean Patent Office, which is incorporated by reference in its entirety as if set forth in full.

BACKGROUND

1. Technical Field

The embodiments described herein relate to a semiconductor memory apparatus, and more particularly, to a local skew detecting circuit for implementation in a semiconductor memory apparatus.

2. Related Art

As a design rule in the fabrication of semiconductor memory apparatus, it is important to monitor certain characteristic changes that can occur as the size of the wafer and the wafer process are reduced. In particular, a critical dimension (CD) of a transistor is an important factor that must be accounted for in the layout of a semiconductor apparatus. The critical dimension (CD) is a minimum dimension required in a width of a pattern that is formed on the wafer.

Two types of skew can effect the fabrication of a semiconductor memory apparatus: local skew, which is generated in relation to a single chip; and global skew which will have a different characteristic for each wafer.

Global skew typically refers to distortions or changes in the physical characteristics of transistors that result from changes in PVT (Process, Voltage, and Temperature) during the fabrication of the wafer. The global skew can create different signal skews for each chip on the wafer. The local skew means that the signal skew is different among circuits of the same function according to the locations (i.e. center, right, and left) in a chip. That is, the critical dimension (CD) of the gate width and the threshold voltage (Vt) are changed according to a location in a chip in the semiconductor memory apparatus, which changes the operating parameters for, e.g., a MOS transistor according to the location.

Accordingly, even circuits that perform the same function, and have the same operating characteristics may behave differently according to the locations thereof.

SUMMARY

A local skew detecting circuit for a semiconductor memory apparatus can detect operation characteristics of similar circuits at different locations.

According to one aspect, there is provided a local skew detecting circuit for a semiconductor apparatus. The local skew detecting circuit can include a reference delay block located on a center of the semiconductor apparatus, the reference delay block being configured to receive a predetermined signal and generate a reference delay signal by delaying the predetermined signal by a delay time and a first timing detecting block located on a first edge of the semiconductor apparatus, the first timing detecting block being configured to receive the predetermined signal, generate a first delay signal by delaying the predetermined signal by the delay time, and detect a first enable timing order of the reference delay signal and the first delay signal to generate a first detection signal.

The semiconductor apparatus can include a reference delay block configured to receive a predetermined signal and generate a reference delay signal by delaying the predetermined signal by a delay time, a first timing detecting block configured to receive the predetermined signal, generate a first delay signal by delaying the predetermined signal by the delay time, and detect a first enable timing order of the reference delay signal and the first delay signal to generate a first detection signal and a first signal control block configured to compensate setup/hold time of a first input signal according to the first detection signal, and generate a first output signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
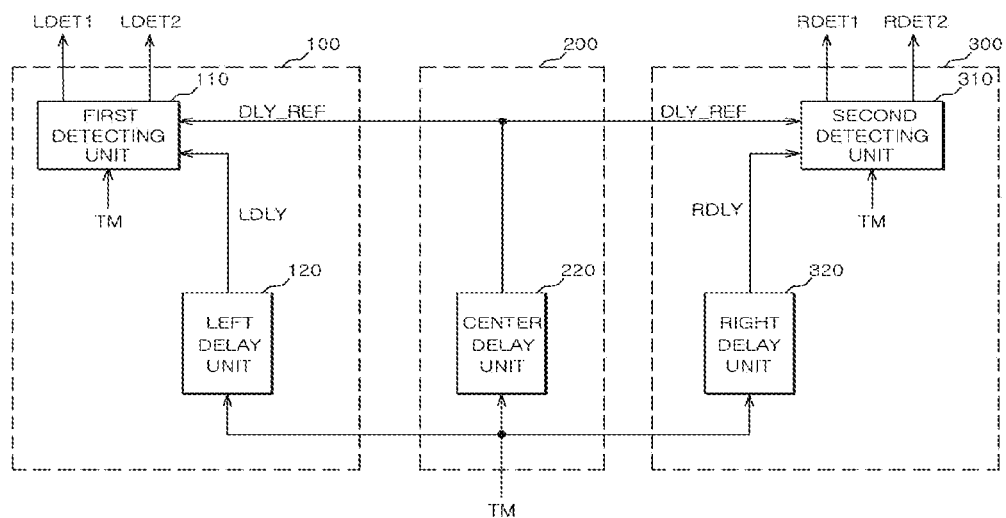
FIG. 1 is a block diagram illustrating a local skew detecting circuit and a compensating circuit according to an embodiment of the present invention.
Figure 1:
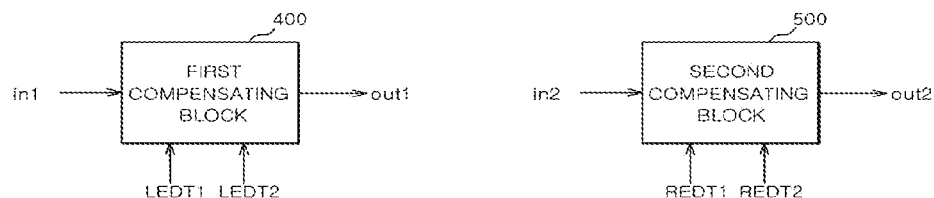

FIG. 1 is a diagram illustrating an example skew detecting circuit 101 and a compensating circuit configured in accordance with one embodiment. Referring to FIG. 1, it can be seen that local skew detecting circuit 101 can include a first timing detecting block 100, a reference delay block 200, and a second timing detecting block 300. The first timing detecting block 100 can be configured to generate a first left detection signal 'LDET1' and a second left detection signal 'LDET2', and to detect the characteristic change of a transistor at a left edge of a chip.

The first timing detecting block 100 can include a first detecting unit 110 and a left delay unit 120. The first detecting unit 110 can be configured to detect an enable timing order of a left delay signal 'LDLY', which is generated by the left delay unit 120 by delaying a test signal 'TM' by a predetermined delay time, and a reference delay signal 'DLY_REF', and to generate the first left detection signal 'LDET1' or the second left detection signal 'LDET2' based thereon.

The reference delay block 200 can include a center delay unit 220 and can be disposed physically at the center of the circuit, i.e., at the center of a chip embodying the circuit 101. The center reference delay unit 220 can be configured to generate the reference delay signal 'DLY_REF' by delaying the test signal 'TM' the same delay time used by left delay circuit 120.

The second timing detecting block 300 can be configured to generate a first right detection signal 'RDET1' and a second right detection signal 'RDET2', and to detect characteristic changes in a right edge of the chip. The second timing detecting block 300 can include a second detecting unit 310 and a right delay unit 320.

The second detecting unit 310 can be configured to detect an enable timing order of a right delay signal 'RDLY', which is delayed by the right delay unit 320, and the reference delay signal 'DLY_REF', and to generate the first right detection signal 'RDET1' or the second right detection signal 'RDET2'.

Specifically, the second detecting unit 310 can be configured to enable the first right detection signal 'RDET1' or the second right detection signal 'RDET2' according to a generation order of the reference delay signal 'DLY_REF' and the right delay signal 'RDLY'. That is, when the right delay signal 'LDLY' goes high earlier than the reference delay signal 'DLY_REF' goes high, then the second detecting unit 310 can be configured to enable the second right detection signal 'RDET2'. Meanwhile, when the right delay signal 'RDLY' goes high after the reference delay signal 'DLY_REF', then the second detecting unit 113 can be configured to enable the first right detection signal 'RDET1'.

A Semiconductor apparatus in accordance with an embodiment can include the local skew detecting circuit and a compensating circuit.

For example, as shown in FIG. 1, the semiconductor apparatus can further include a first compensating block 400 and a second compensating block 500.

The first compensating block 400 is configured to compensate setup/hold time of a first input signal in1 according to the first left detection signal LDET1 and the second left detection signal LDET2, and generate a first output signal out1.

The first compensating block 400 can be configured by including a general setup/hold time control circuit.

The second compensating block 500 is configured to compensate setup/hod time of a second input signal in2 according to the second right detection signal RDET1 and the second detection signal RDET2, and generate a second output signal out2.

The second compensating block 500 can be configured by including a general setup/hold time control circuit.

In the embodiment, the test signal TM is used as a source signal to generate the reference delay signal DLY_REF, the left delay signal LDLY, and the right delay signal RDLY.

However, the test signal TM as well as any other predetermined signal can be used as the source signal.

Figure 2:
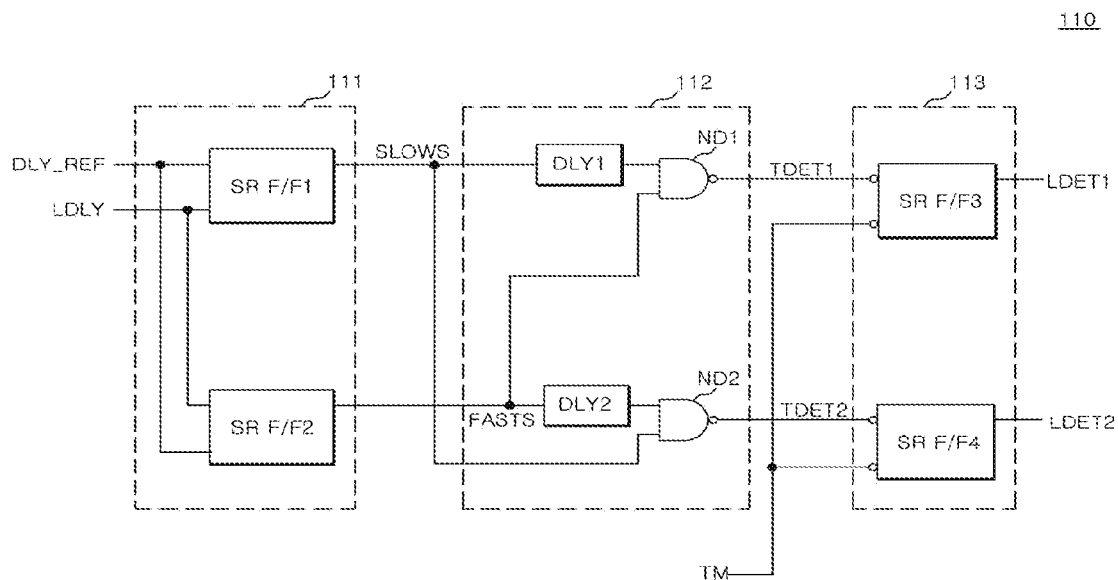
FIG. 2 is a circuit diagram illustrating a first detecting unit that can be included in the circuit shown in FIG. 1.

The first detecting unit 110 can be configured to operate in a similar manner. FIG. 2 is a diagram illustrating the first detecting unit 110 in more detail. It will be understood that second detecting unit 310 can be similar to first detecting unit 110. Accordingly, a detailed description of second detecting unit 310 will be omitted.

Referring to FIG. 2, the first detecting unit 110 can include a signal input unit 111, a signal control unit 112, and a detection signal output unit 113. The signal input unit 111 can include first and second SR flip-flops SR F/F1 and SR F/F2. The first SR flip-flop SR F/F1 can include a set terminal S, to which the reference delay signal 'DLY_REF' is input, a reset terminal R, to which the left delay signal 'LDLY' is input, and a positive output terminal Q that outputs a slow signal 'SLOWS'.

The second SR flip-flop SR F/F2 can include a set terminal S, to which the left delay signal 'LDLY' is input, a reset terminal R, to which the reference delay signal 'DLY_REF' is input, and a positive output terminal Q that outputs a fast signal 'FASTS'. The signal input unit 111 can be configured to generate the fast signal 'FASTS' and the slow signal 'SLOWS', respectively, based on whether the left delay signal 'LDLY' goes high before the reference delay signal 'DLY_REF'. This can be explained with the aid of FIGS. 4 and 5.

Figure 4:
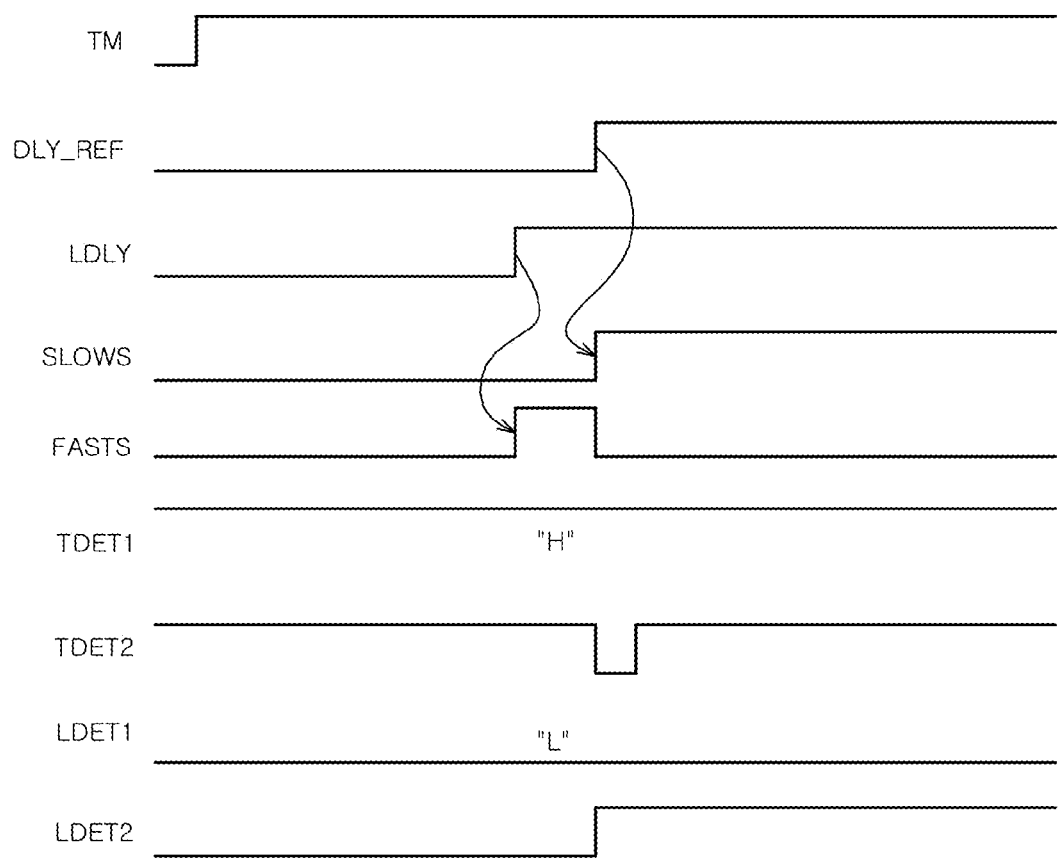
FIG. 4 is a first timing diagram illustrating operation of the circuit shown in FIG. 1.

For example, referring to FIG. 4, when the left delay signal 'LDLY' transits high level before the reference delay signal 'DLY_REF', the first SR flip-flop SR F/F1 is set at the rising edge of the reference delay signal 'DLY_REF'. However, the first SR flip-flop SR F/F1 cannot be reset, because the rising timing of the left delay signal 'LDLY' is earlier than the rising timing of the reference delay signal 'DLY_REF'.

Accordingly, the first SR flip-flop SR F/F1 outputs a slow signal 'SLOWS' that transitions from a 'low' level to a 'high' level at a rising edge of the reference delay signal 'DLY_REF' and is then maintained at a 'high' level. The second SR flip-flop SR F/F2 is set at a rising edge of the left delay signal 'LDLY', and is reset at a rising edge of the reference delay signal 'DLY_REF'. Accordingly, the second SR flip-flop SR F/F2 outputs a fast signal 'FASTS', which transitions from a 'low' level to a 'high' level when the slow signal 'SLOWS' transitions to a 'high' level, but then transitions low again. The fast signal 'FASTS' will have a pulse width in this scenario that corresponds to a delay time from when the left delay signal 'LDLY' transits high level to when the reference delay signal 'DLY_REF' transits high level.

Figure 5:
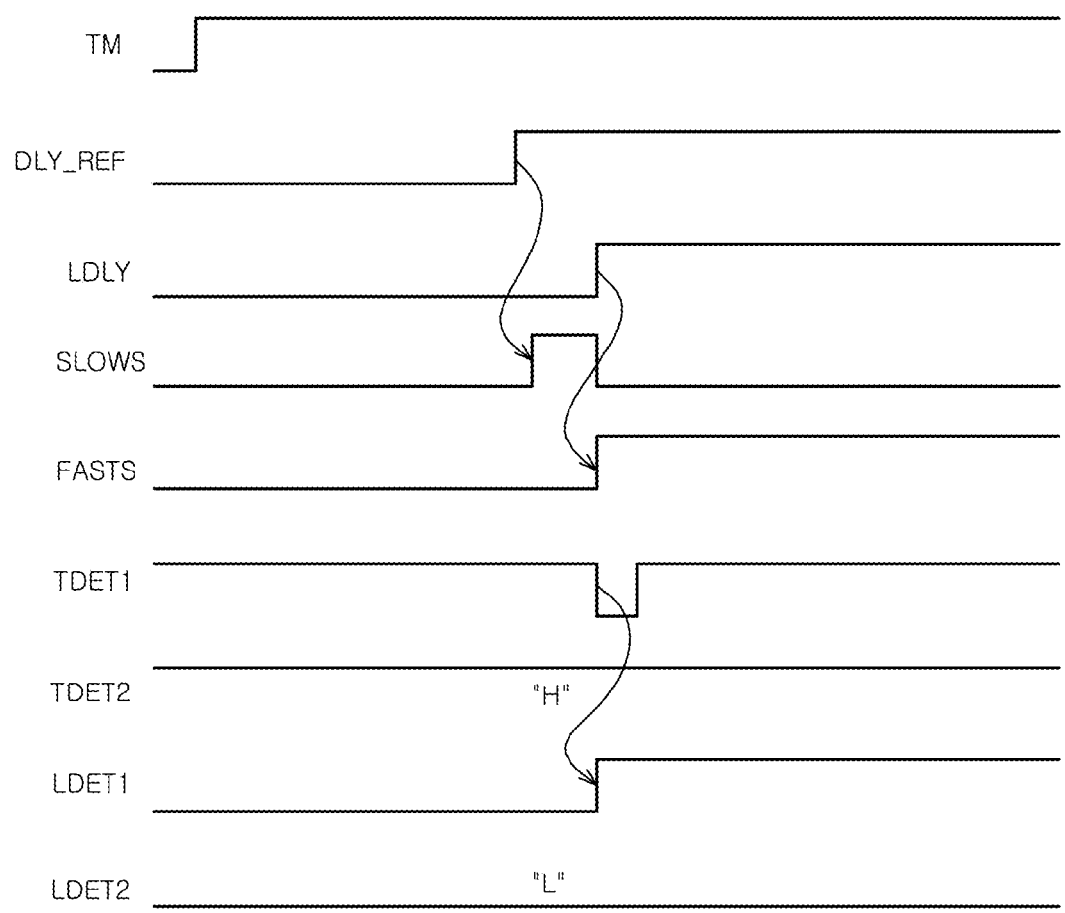
FIG. 5 is a second timing diagram illustrating operation of the circuit shown in FIG. 1.

Referring to FIG. 5, when The left delay signal 'LDLY' goes high after the reference delay signal 'DLY_REF', then the first SR flip-flop SR F/F1 will be set when the reference delay signal 'DLY_REF' goes from a 'low' level to a 'high' level. The first SR flip-flop SR F/F1 is reset when the left delay signal 'LDLY' transitions to a 'high' level, which causes the slow signal 'SLOWS' to transition from a 'high' level back to a 'low' level. Thus, the slow signal 'SLOWS' has a pulse width in this scenario that is equal to the delay between when the reference delay signal 'DLY_REF' transits high level and when the left delay signal 'LDLY' transits high level.

In this scenario, the second flip-flop SR F/F2 cannot be reset after transitioning to a 'high' level when the left delay signal 'LDLY' transitions from a 'low' level to a 'high' level. Therefore, the second flip-flop SR F/F2 outputs a fast signal 'FASTS' that is maintained at a 'high' level.

The signal control unit 112 can include first and second delayers DLY1 and DLY2, and first and second NAND gates ND1 and ND2. The first delayer DLY1 can be configured to receive the slow signal 'SLOWS' and to output the slow signal 'SLOWS' after delaying the slow signal 'SLOWS' for a predetermined time. The first NAND gate ND1 can be configured to receive the fast signal 'FASTS' and the delayed slow signal 'SLOWS', and to generate a first timing detection signal 'TDET1'.

The second delayer DLY2 can be configured to receive the fast signal 'FASTS' and to output the fast signal 'FASTS' after delaying the fast signal 'FASTS' for a predetermined time. The second NAND gate ND2 can be configured to receive the delayed fast signal 'FASTS' and the slow signal 'SLOWS', and to generate a second timing detection signal 'TDET2'.

Thus, referring to FIG. 4, when the left delay signal 'LDLY' transits high level before the reference delay signal 'DLY_REF', i.e., when the slow signal 'SLOWS' is maintained at a high level, while the fast signal 'FASTS' is pulsed high, then The signal control unit 112 will generate the first timing detection signal 'TDET1' that is maintained at a 'high' level. Further, the signal control unit 112 will also generate the second timing detection signal 'TDET2' that is pulsed low when both the slow signal 'SLOWS' and the delayed fast signal 'FASTS' are both high level.

Referring to FIG. 5, when the left delay signal 'LDLY' transits high level after the reference delay signal 'DLY_REF', then the signal control unit 112 will generate the first timing detection signal 'TDET1', which is pulsed low when both the delayed slow signal 'SLOWS' and the fast signal 'FASTS' are high. Meanwhile, the signal control unit 112 will generate the second timing detection signal 'TDET2' that is maintained at a 'high' level.

The detection signal output unit 113 can include third and fourth SR flip-flops SR F/F3 and SR F/F4. The third SR flip-flop SR F/F3 can include a set terminal S, to which an inverted signal of the first timing detection signal 'TDET1' is input, a reset terminal R, to which an inverted signal of a test signal 'TM' is input, and a positive output terminal Q that outputs the first left detection signal 'LDET1'. The fourth SR flip-flop SR F/F4 can include a set terminal S, to which an inverted signal of the second timing detection signal 'TDET2' is input, a reset terminal R, to which an inverted signal of the test signal 'TM' is input, and a positive output terminal Q that outputs the second left detection signal 'LDET2'.

Referring to FIG. 4, when the left delay signal 'LDLY' transits high level before the reference delay signal 'DLY_REF', the inverted signal of the first timing detection signal 'TDET1', which is always high level, is input to the set terminal S of the third SR flip-flop SR F/F3 and the test signal 'TM', which is high level, is input to the reset terminal R. As a result, the detection signal output unit 113 disables the first left detection signal 'LDET1' at a 'low' level.

At the same time, the inverted signal of the second timing detection signal 'TDET2', which is pulsed low level, is input to the set terminal S of the fourth SR flip-flop SR F/F4 and the test signal 'TM' is input to the reset terminal R. As a result, the detection signal output unit 113 enables the second left detection signal 'LDET2' at a 'high' level, when the second timing detection signal 'TDET2' is pulsed low level.

Referring to FIG. 5, when the left delay signal 'LDLY' goes low after the reference delay signal 'DLY_REF', the detection signal output unit 113 enables the first left detection signal 'LDET1', when the first detection signal 'TDET1' is pulsed low level, but disables the second left detection signal 'LDET2'.

Figure 3:
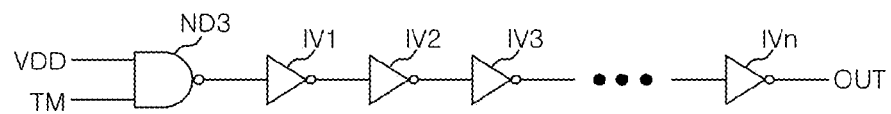
FIG. 3 is a circuit diagram illustrating a left delay unit that can be included in the circuit shown in FIG. 1.

FIG. 3 is diagram illustrating the right delay unit 320 in more detail. It will be understood that the left delay unit 120 and the center delay unit 220 can be configured in a similar manner. Accordingly, a detailed description of the left delay unit 120 and the center delay unit 220 will be omitted. However, it will be understood that the left delay unit 120, the center delay unit 220, and the right delay unit 320 can have different delay characteristics according to delay elements and wiring lines.

Referring to FIG. 3, the right delay unit 320 can include a third NAND gate ND3 and a plurality of inverters IV<1:n>. The third NAND gate ND3 can be supplied with a power supply voltage VDD and the test signal 'TM', on which it can perform a NAND operation and generate an output signal passed to the first inverter IV1. The first inverter IV1 receives the output signal of the third NAND gate ND3, inverts it, and generates an output signal to be applied to the second inverter IV2, and so on through the n inverters. As can be seen, the plurality of inverters IV<1:n> are connected in series. Also, each inverter has a specified delay time. Thus, connected the inverters in series in this manner provides a predetermined delay time.

Referring to FIG. 1, it can be seen that the left delay signal 'LDLY', the right delay signal 'RDLY', and the reference delay signal 'DLY_REF' are therefore generated from the same test signal 'TM' using the same delay. Accordingly, if the circuit characteristics were the same, then these signals would all transition at the same time. But due to the local skew described above, the circuit characteristics will vary by location. These variations will cause the signals to transition at different times, depending on the location, and these differences can be detected as described above, and communicated via the first and second, left and right delay signals, 'LDET1', 'LDET2', 'RDET1', and 'RDET2', respectively.

Thus, the local skew detecting circuit 101 can detect that the local skew generated for each location in the chip due to, e.g., changes in the gate width CD or the threshold voltage Vt, which as explained can have different characteristics for different locations, even in the same circuit or chip. Therefore, the local skew detecting circuit 101 can then generate the detection signals, which are generated by detecting the characteristic change for the locations (i.e. center, right, and left) in the chip, and provide them, e.g., to a setup/hold time circuit, such as the first and second compensating block 400 and 500, which can be configured to compensate for the characteristic change, thereby allowing the characteristics for each location in the same circuit to be the same.

To explain the present invention, the embodiment is described as the semiconductor memory apparatus.

However, the present invention is not limited as the semiconductor memory apparatus. A principle of the present invention, detecting a skew by using outputs of each other delay unit, can be utilized the semiconductor memory apparatus as well as all of the semiconductor apparatus.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A local skew detecting circuit for a semiconductor apparatus, comprising:
   a reference delay block located on a center of the semiconductor apparatus, the reference delay block being configured to receive a predetermined signal and generate a reference delay signal by delaying the predetermined signal by a delay time; and
   a first timing detecting block located on a first edge of the semiconductor apparatus, the first timing detecting block being configured to receive the predetermined signal, generate a first delay signal by delaying the predetermined signal by the delay time, and detect a first enable timing order of the reference delay signal and the first delay signal to generate a first detection signal.

2. The local skew detecting circuit of claim 1, further comprising:
   a second timing detecting block located on a second edge of the semiconductor apparatus, the second timing detecting block being configured to receive the predetermined signal, generate a second delay signal by delaying the predetermined signal by the delay time, and detect a second enable timing order of the reference delay signal and the second delay signal to generate a second detection signal.

3. The local skew detecting circuit of claim 2, wherein the second timing detecting block comprises:
   a right delay unit configured to receive the predetermined signal and to generate the second delay signal delayed by the delay time; and a second detecting unit coupled with the right delay unit, the second detecting unit being configured to output a first right detection signal and a second right detection signal according to a generation order of the second delay signal and the reference delay signal.

4. The local skew detecting circuit of claim 3, wherein the second detecting unit is configured to activate the first right detection signal when the reference delay signal transits high level before the second delay signal.

5. The local skew detecting circuit of claim 3, wherein the second detecting unit is configured to activate the second right detection signal when the reference delay signal transits high level after the second delay signal.

6. The local skew detecting circuit of claim 2, wherein the first edge and the second edge are located in opposite sides of the semiconductor apparatus.

7. The local skew detecting circuit of claim 1, wherein the first timing detecting block comprises:
a left delay unit configured to receive the predetermined signal and generate the first delay signal by delaying the predetermined signal by the delay time; and
a first detecting unit coupled with the left delay unit, the first detecting unit being configured to receive the first delay signal and the reference delay signal and to output a first left detection signal and a second left detection signal according to a generation order of the first delay signal and the reference delay signal.

8. The local skew detecting circuit of claim 7, wherein the first detecting unit is configured to activate the first left detection signal when the reference delay signal transits high level before the first delay signal.

9. The local skew detecting circuit of claim 7, wherein the first detecting unit is configured to activate the second left detection signal when the reference delay signal transits high level after the first delay signal.

10. A semiconductor apparatus, comprising:
a reference delay block configured to receive a predetermined signal and generate a reference delay signal by delaying the predetermined signal by a delay time;
a first timing detecting block configured to receive the predetermined signal, generate a first delay signal by delaying the predetermined signal by the delay time, and detect a first enable timing order of the reference delay signal and the first delay signal to generate a first detection signal; and
a first signal control block configured to compensate setup/hold time of a first input signal according to the first detection signal, and generate a first output signal.

11. The semiconductor apparatus of claim 10, further comprising:
a second timing detecting block configured to receive the predetermined signal, generate a second delay signal by delaying the predetermined signal by the delay time, and detect a second enable timing order of the reference delay signal and the second delay signal to generate a second detection signal.

12. The semiconductor apparatus of claim 11, wherein the second timing detecting block comprises:
a right delay unit configured to receive the predetermined signal and to generate the second delay signal delayed by the delay time; and
a second detecting unit coupled with the right delay unit, the second detecting unit being configured to output a first right detection signal and a second right detection signal according to a generation order of the second delay signal and the reference delay signal.

13. The semiconductor apparatus of claim 12, wherein the second detecting unit is configured to activate the first right detection signal when the reference delay signal transits high level before the second delay signal.

14. The semiconductor apparatus of claim 12, wherein the second detecting unit is configured to activate the second right detection signal when the reference delay signal transits high level after the second delay signal.

15. The semiconductor apparatus of claim 11, wherein the first timing detecting block and the second timing detecting block are respectively located on opposite sides each other, as the center with the reference delay block.

16. The semiconductor apparatus of claim 11, further comprising:
a second signal control block configured to compensate setup/hold time of a second input signal according to the second detection signal, and generate a second output signal.

17. The semiconductor apparatus of claim 10, wherein the first timing detecting block comprises:
a left delay unit configured to receive the predetermined signal and generate the first delay signal by delaying the predetermined signal by the delay time; and
a first detecting unit coupled with the left delay unit, the first detecting unit being configured to receive the first delay signal and the reference delay signal and to output a first left detection signal and a second left detection signal according to a generation order of the first delay signal and the reference delay signal.

18. The semiconductor apparatus of claim 17, wherein the first detecting unit is configured to activate the first left detection signal when the reference delay signal transits high level before the first delay signal.

19. The semiconductor apparatus of claim 17, wherein the first detecting unit is configured to activate the second left detection signal when the reference delay signal transits high level after the first delay signal.

* * * * *